(12) United States Patent
Oh et al.

(10) Patent No.: US 9,335,104 B2
(45) Date of Patent: May 10, 2016

(54) THERMALLY-CONDUCTIVE ELASTIC BODY

(71) Applicants: LG ELECTRONICS INC., Seoul (KR); E-SONG EMC CO., LTD., Seoul (KR)

(72) Inventors: Sewook Oh, Seoul (KR); Sanghyun Kim, Seoul (KR)

(73) Assignees: LG ELECTRONICS INC., Seoul (KR); E-SONG EMC CO., LTD., Seoul (KR)

( * ) Notice: Subject to any disclaimer, the term of this patent is extended or adjusted under 35 U.S.C. 154(b) by 303 days.

(21) Appl. No.: 14/131,365

(22) PCT Filed: Jun. 13, 2013

(86) PCT No.: PCT/KR2013/005220
§ 371 (c)(1),
(2) Date: Jan. 7, 2014

(87) PCT Pub. No.: WO2014/021548
PCT Pub. Date: Feb. 6, 2014

(65) Prior Publication Data
US 2014/0332193 A1    Nov. 13, 2014

(30) Foreign Application Priority Data
Jul. 31, 2012    (KR) .................. 10-2012-0083926

(51) Int. Cl.
*F28F 21/02*    (2006.01)
*H05K 7/20*    (2006.01)
(Continued)

(52) U.S. Cl.
CPC . *F28F 21/02* (2013.01); *B32B 3/04* (2013.01); *B32B 9/007* (2013.01); *B32B 9/045* (2013.01);
(Continued)

(58) Field of Classification Search
CPC ..... F28F 21/02; F28F 21/06; F28F 2013/006; F28F 2255/02; B32B 9/007; B32B 3/04; B32B 9/045; B32B 2250/03; B32B 2250/04; B32B 2307/302; B32B 2307/51; B32B 2457/00; H05K 7/20454
USPC .................. 361/679.46–679.54, 688–723
See application file for complete search history.

(56) References Cited

U.S. PATENT DOCUMENTS 6,097,598 A * 8/2000 Miyahara ............ H01L 23/3732
165/185
6,206,531 B1   3/2001 Williams et al.
(Continued)

FOREIGN PATENT DOCUMENTS

CN      101489346 A    7/2009
JP      2001-111285 A    4/2001
(Continued)

*Primary Examiner* — Zachary M Pape
(74) *Attorney, Agent, or Firm* — Birch, Stewart, Kolasch & Birch, LLP

(57) ABSTRACT

Disclosed is a thermally-conductive elastic body that effectively dissipates heat generated from a heat generation source such as an electronic product and prevents a phenomenon in which small graphite fragments are separated from (fall off) a graphite layer by completely sealing up the graphite layer that conducts the heat. The thermally-conductive elastic body according to the embodiments of the present disclosure includes an elastic body and a thermally conductive layer that is formed to be wrapped around an external surface of the elastic body, in which the thermally conductive layer includes a first base film and a graphite layer that is internally arranged within an edge region of the first base film, and in which the edge region of the first base film is attached to the elastic body in such a manner that the graphite layer is sealed up.

16 Claims, 3 Drawing Sheets

(51) Int. Cl.
*B32B 3/04* (2006.01)
*B32B 9/00* (2006.01)
*B32B 9/04* (2006.01)
*F28F 21/06* (2006.01)
*F28F 13/00* (2006.01)

(52) U.S. Cl.
CPC ............ *F28F 21/06* (2013.01); *H05K 7/20454* (2013.01); *B32B 2250/03* (2013.01); *B32B 2250/04* (2013.01); *B32B 2307/302* (2013.01); *B32B 2307/51* (2013.01); *B32B 2457/00* (2013.01); *F28F 2013/006* (2013.01); *F28F 2255/02* (2013.01)

(56) References Cited

U.S. PATENT DOCUMENTS

| | | | |
|---|---|---|---|
| 8,273,209 B2* | 9/2012 | Hattori | B32B 7/12 156/297 |
| 9,067,287 B2* | 6/2015 | Ofoma | H01L 23/34 |
| 2003/0128519 A1* | 7/2003 | Justo | H01L 23/3737 361/704 |
| 2010/0142154 A1* | 6/2010 | Collet | H05K 7/20454 361/714 |
| 2012/0033384 A1* | 2/2012 | Pillai | H05K 7/20445 361/718 |
| 2016/0004284 A1* | 1/2016 | Cohen | G06F 1/20 361/679.54 |

FOREIGN PATENT DOCUMENTS

| | | |
|---|---|---|
| JP | 2002-319653 A | 10/2002 |
| JP | 2007-184392 A | 7/2007 |
| JP | 2008-272976 A | 11/2008 |
| KR | 10-2010-0035887 A | 4/2010 |
| KR | 10-2011-0088779 A | 4/2010 |
| KR | 10-0953679 B1 | 4/2010 |
| TW | 410539 B | 11/2000 |

* cited by examiner

THERMALLY-CONDUCTIVE ELASTIC BODY

TECHNICAL FIELD

The present invention relates to a thermally-conductive elastic body.

BACKGROUND ART

Generally, when used for a period of time, generates heat, electronic products, such as a computer, a mobile phone, a telephone, and a television set, generates a lot of heat. The heat generated from a heat generation source such as the electronic product needs to be dissipated immediately. When this is done, there is a likelihood that components within the electronic product will be out of order, or malfunction, thereby shortening the life of the electronic product or causing a fire.

DISCLOSURE OF THE INVENTION

Therefore, an object of the present invention is to provide a thermally-conductive elastic body that effectively dissipates heat generated from a heat generation source such as an electronic product and prevents a phenomenon in which small graphite fragments are separated from (fall off) a graphite layer by completely sealing up the graphite layer that conducts the heat To achieve these and other advantages and in accordance with the purpose of the present invention, as embodied and broadly described herein, there is provided a thermally-conductive elastic body including an elastic body and a thermally conductive layer that is formed to be wrapped around an external surface of the elastic body, in which the thermally conductive layer includes a first base film and a graphite layer that is internally arranged within an edge region of the first base film, and in which the edge region of the first base film is attached to the elastic body in such a manner that the graphite layer is sealed up.

The thermally-conductive elastic body may further an adhesive layer or a bonding agent layer with which the edge region of the first base film is attached to the elastic body.

In thermally-conductive elastic body, an area of the first base film may be greater than an area of the graphite layer.

In the thermally-conductive elastic body, the thermally-conductive layer may be wrapped around the external surface of the elastic body in such a manner that both end surfaces, in a lengthwise direction, of the elastic body, are opened.

In the thermally-conductive elastic body, both of the edge regions, in the lengthwise direction, of the first base film may be folded inward in the direction of the elastic body and then are attached to the elastic body with an adhesive or a bonding agent.

In the thermally-conductive elastic body, the edge region of the first base film may not include the graphite layer.

In thermally-conductive elastic body, a width of the edge region of the first base film may range from 2 mm to 5 mm.

The thermally-conductive elastic body may further include a first adhesive layer or a first bonding agent layer with which one surface of the graphite layer and the first base film are attached to each other.

In the thermally-conductive elastic body, the thermally conductive layer may further include a second adhesive layer or a second bonding agent layer that is formed on the other surface of the graphite layer and a second base film that is formed on the second adhesive layer or the second bonding agent layer, and the edge region of the first base film and the edge region of the second base film may not include the graphite layer and may be attached to each other with the first and second adhesive layers or the first and second bonding agent layers.

In the thermally-conductive elastic body, each of the first and second base films may be one that is selected from the group consisting of a polyethylene terephthalate (PET) film, a polyethylene (PE) film, a polypropylene (PP) film, an ethylene vinyl acetate (EVA) film, a polyvinylidene chloride (PVC) film, a polyimide (PI), a polyvinylidene chloride (PVDC) film, a polyurethane (PU) film, a polycarbonate (PC) film, and an acrylic resin film.

In the thermally-conductive elastic body, the elastic body may be one that is selected from the group consisting of polyurethane (PU)-based sponge, an acrylic-based sponge, a chloroprene rubber (CR)-based sponge, ethylene propylene diene M-class (EPDM) rubber-series sponge, a silicone-based sponge, a fluoride resin-based sponge, and a melamine resin-based sponge.

In the thermally-conductive elastic body, the elastic body may be made of a conjugated material that is obtained by impregnating any one of the sponges into a solution of silicone or fluoride resin or melamine resin.

In the thermally-conductive elastic body, the bonding agent layer may be a hot-melt bonding agent or a liquefied resin bonding agent.

In the thermally-conductive elastic body, the hot-melt bonding agent may be formed of one that is selected from the group consisting of ethylene vinyl acetate (EVA), polyester, polyethylene, polyisobutylene, polyamide, polyurethane, polyethylene terephthalate, polypropylene, and polyimide.

In the thermally-conductive elastic body, the hot-melt bonding agent may be one of hot-melt bonding agents that are obtained by including one or two more of carbon nanotube (CNT), carbon, alumina, and metal powder in any one of the hot-melt bonding agents.

In the thermally-conductive elastic body, a thickness of the graphite layer may range from 10 μm to 500 μm.

The thermally-conductive elastic body may further include a double-sided adhesive tape that is formed at least one surface or multiple surfaces of the thermally-conductive elastic body.

In the thermally-conductive elastic body, the adhesive may be one that is selected from the group consisting of an acrylic-adhesive, a silicone-based adhesive, a PU-based adhesive, and a fluoride-based adhesive.

In the thermally-conductive elastic body, the adhesive may be one of adhesives that are obtained by including one or two more of carbon nanotube (CNT), carbon, alumina, and metal powder in any one of the adhesives.

A thermally-conductive elastic body according to the present embodiments is capable of effectively dissipating heat generated from a heat generation source such as an electronic product and prevents a phenomenon in which small graphite fragments are separated from (fall off) a graphite layer by completely sealing up the graphite layer that conducts the heat.

For example, in the thermally-conductive elastic body according to the present invention, a graphite layer is completely sealed up by a base film. Therefore, small graphite fragments that are separated from a graphite layer are prevented from being introduced into electronic components of the electronic product and the like although an internal or external shock is applied when the thermally-conductive elastic body is attached between a heat generation source and a heat dissipation unit in the electronic product and the like, and although the thermally-conductive elastic body is used for a long period of time. Thus, a short circuit, a fire, or a malfunction can be prevented before.

The thermally-conductive elastic body according to the present embodiments can be easily detachably attached to the heat generation source of the electronic product and the like.

MODES FOR CARRYING OUT THE PREFERRED EMBODIMENTS

Figure 1:
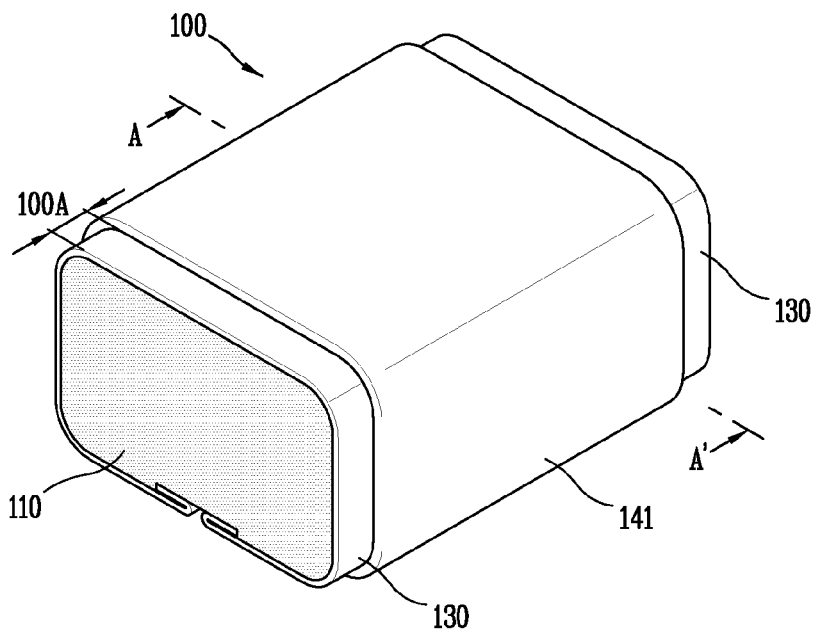
FIG. 1 is a view illustrating a thermally-conductive elastic body according to a first embodiment of the present invention.

Reference will now be made in detail to the preferred embodiments of the present invention, examples of which are illustrated in the accompanying drawings.

Technical terms used in the present specification is only for describing specific embodiments and notably, is not intended to impose any limitation to the present invention. In addition, the technical terms used in the specification should be construed in such a manner that they are usually understandable to a person of ordinary skill in the art that the present invention pertains to, unless otherwise specifically defined in the present specification. The technical terms should not be construed too broadly or too narrowly. In addition, when the technical terms used in the present specification are ones that do not exactly express the idea of the present invention, they should be replaced with the ones fully understandable to a person of ordinary skill and be understood to that extent. In addition, general terms used in the present specification should be construed as defined in a dictionary or in the context and should not be construed too narrowly.

In addition, a word expressed in the singular, used in the present specification is construed as being in the plural, unless otherwise distinctively meant in the content. The expression "is configured form or includes constituent elements or steps," used in the present specification, should not be construed as including all of the constituent elements or all of the steps and should be construed in such a manner that, among all of the constituent elements or all of the steps, some of the constituent elements or some of the steps may not be included or additional constituent elements or additional steps may be further included.

In addition, the expressions that mean ordinal numbers in the specification, such as "first," "second," and the like, are used for describing various constituent elements without imposing any limitation to the various constituent elements. The expressions that mean the ordinal numbers are used only for distinguishing among the constituent elements of the same kind. For example, a first constituent element may be named a second constituent element without departing from scope of claims. Similarly, the second constituent element may be named the first constituent element.

Desirable embodiments according to the present invention are described referring to the accompanying drawings. Like constituent elements are given like reference numerals and a redundant description of the like constituent elements is omitted.

In addition, when it is determined that a detailed description of a technology known in the related art prevents the nature and gist of the present invention from being made apparent, the detailed description of the technology is omitted. In addition, the accompanying drawings are only for helping get an easy understanding of the idea of the present invention and notably, should not be construed as imposing any limitation on the idea of the invention.

A thermally-conductive elastic body (or a thermally-conductive elastic gasket) is described below referring to FIGS. 1 to 5, which effectively can dissipate heat generated from a heat generation source, such as an electronic product, and can prevent a phenomenon in which small graphite fragments are separated from (falls off) the graphite layer by completely sealing up a graphite layer that conducts the heat.

FIG. 1 is a view illustrating a thermally-conductive elastic body according to a first embodiment of the present invention.

As illustrated in FIG. 1, the thermally-conductive elastic body 100 according to the first embodiment includes an elastic body (for example, a sponge) 110 and a thermally conductive layer (or a thermal conductivity) 141 that is formed to be wrapped around an external surface of one portion of the elastic body 110 (for example, the sponge). The thermally conductive layer 141 includes a first base film 130 and a graphite layer (or a graphite sheet) 140 that is internally positioned within the first base film 130. The first base film 130 is attached to the elastic body (for example, the sponge) 110 in such a manner the graphite layer (or the graphite sheet) 140 is completely sealed up.

Like a band, the thermally conductive layer 141 that is formed from the graphite layer 140 that is internally positioned within the first base film 130 is wrapped around the external surface of one portion of the elastic body (for example, the sponge) 110 as a band. For example, the thermally conductive layer 141 is wrapped around an external surface of the elastic body (for example, the sponge) 110 in such a manner that both end surfaces, in a lengthwise direction, of the elastic body (for example, the sponge) 110 are opened (exposed).

The thermally-conductive elastic body 100 according to the first embodiment of the present invention may further include an adhesive (an adhesive layer) or a bonding agent (a bonding agent layer) that is formed between the elastic body 110 and the thermally conductive layer 141 in order to fix the thermally conductive layer 141 to the elastic body (for example, the sponge) 110.

The first base film 130 is formed in such a manner that its area is greater than that of the graphite layer (or the graphite sheet) 140 that is internally positioned within the first base film 130 so that an entire end region (an edge region) of the first base film 130 may be bonded to the elastic body 110 with the adhesive and the bonding agent. For example, in order to completely seal up the graphite layer 140 in such a manner that the small graphite fragments are prevented from being separated from the graphite layer 140, the entire end region (the edge region) of the first base film 130 is bonded to the elastic body 110 with the adhesive or the bonding agent.

The entire end region (the edge region) of the first base film 130 or both end regions, in the width direction, of the first base film 130 do not include the graphite layer (or the graphite sheet) 140. For example, the entire end region of the first base film 130 or both of the end regions, in the width direction, of the first base film 130 (both end regions, in the lengthwise direction, of the elastic body 110) do not include the graphite layer (or the graphite sheet) 140 in order to be bonded to the elastic body 110 with the adhesive or the bonding agent.

A width 100A of the entire end region (the edge region) of the first base film 130 is uniform or is not uniform. The width 100A of the entire end region (the edge region) of the first base film 130 ranges from 2 mm to 5 mm.

The sponge 110 is used as the elastic body 110. For example, the elastic body 110 is made of any one of polyurethane (PU)-based sponge, acrylic-based sponge, chloroprene rubber (CR)-based sponge, and ethylene propylene diene M-class (EPDM) rubber sponge, but a material of the elastic body 110 is not limited to these. That is, whatever has resilience and elasticity may be used as the elastic body 110.

A single material-based sponge, such as silicone or fluoride resin, or a heat-resistant sponge that is made of a conjugated material may be used as the elastic body 110 to improve heat-resistance. The heat-resistant sponge made of the conjugated material is obtained by impregnating any one of polyurethane-based sponge, acrylic-based sponge, and ethylene propylene diene M-class (EPDM) rubber sponge into a solution of silicone or fluoride resin, for coating.

A thickness and a size of the elastic body 110 are not limited. The elastic body 110 may be formed to a thickness of equal to or more than 1 mm for resilience and elasticity.

Figure 2:
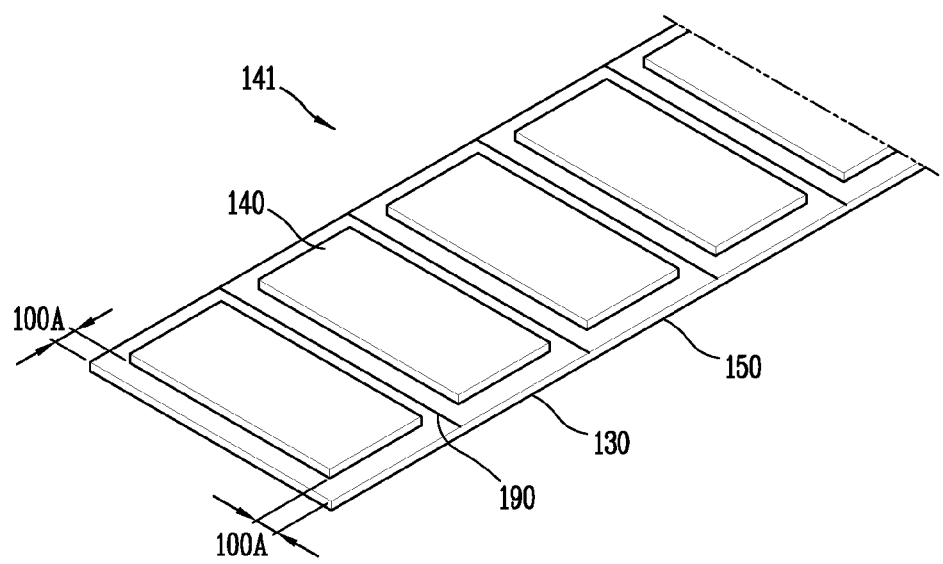
FIG. 2 is a view illustrating a process of manufacturing the thermally conductive layer of the thermally-conductive elastic body according to the first embodiment.

FIG. 2 is a view illustrating a process of manufacturing the thermally conductive layer of the thermally-conductive elastic body according to the first embodiment.

As illustrated in FIG. 2, the thermally conductive layer 141 according to the first embodiment of the present invention is manufactured by forming the graphite layer 140 that are successively arranged (internally-positioned) at regular intervals on the base films and 130 and 150 and then cutting the base films 130 and 150 along the multiple imaginary cutting lines.

The width 100A of the edge, in a fourth direction, of the base films 130 and 150, on which the graphite layer 140 is not internally positioned, ranges from 2 mm to 5 mm. For example, if the width of the 100A of the edge is less than 2 mm, the sealing-up of the graphite layer 140 is not completed. Conversely, if the width 100A of the edge is equal to or more than 5 mm, only a size of the base films 130 and 150 is increased without a further heat dissipation effect and thus heat conduction efficiency is decreased because a relatively-larger area of the graphite layer 140 cannot be used in a limited space.

Figure 3:
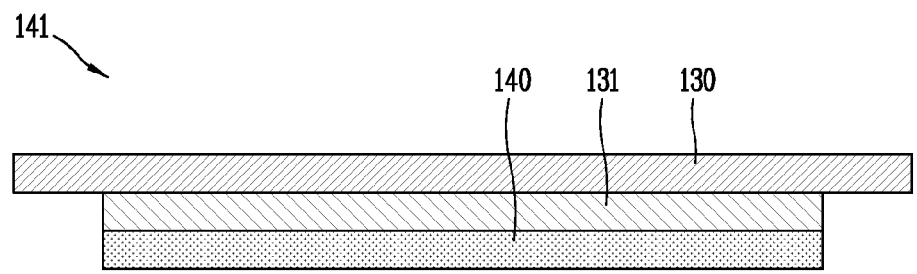
FIG. 3 is a view illustrating the thermally conductive layer according to the first embodiment of the present invention.

FIG. 3 is a view illustrating the thermally conductive layer according to the first embodiment of the present invention.

As illustrated in FIG. 3, the thermally conductive layer 141 according to the first embodiment of the present invention includes the first base film 130, a first adhesive or a first bonding agent 131 that is formed on (attached to) the first base film 130, and the graphite layer (or the graphite sheet) 140 that is attached to the first adhesive or the first bonding agent 131.

A thickness of the graphite layer 140 ranges from 10 μm to 500 μm. If the graphite layer 140 is formed to the thickness of less than 10 μm, heat dissipation efficiency is at an insufficient level. Conversely, if the thickness of the graphite layer 140 exceeds 500 μm, only a thickness of the sheet is increased without a further heat dissipation effect.

The thickness of the first base film 130 ranges from 5 μm to 50 μm. If the first base film 130 is formed to the thickness of less than 5 μm, mechanical strength that protects a surface of the graphite layer 140 is decreased. Conversely, if the thickness of the base film 130 is equal to or more than 50 μm, the heat conduction efficiency is decreased.

A thickness of the first adhesive or the first bonding agent 131 ranges from 5 □μm to 50 μm. If the first adhesive or the first bonding agent 131 is formed to the thickness of less than 5 μm, bonding strength is decreased. If the first adhesive or the first bonding agent 131 is formed to the thickness of equal to or more than 50 μm, the heat conduction efficiency is decreased.

Figure 4:
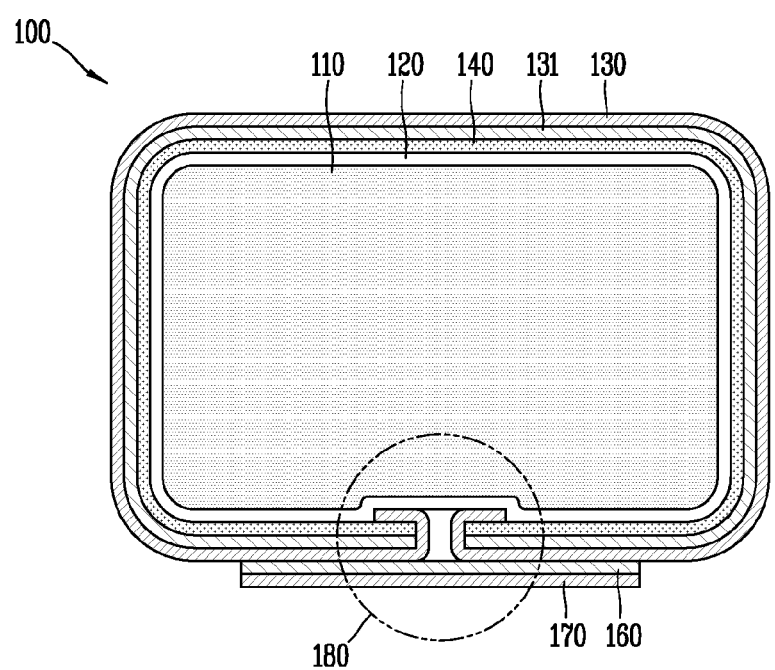
FIG. 4 is a cross-sectional view taken along a line A-A' in FIG. 1.

FIG. 4 is a cross-sectional view taken along a line A-A' in FIG. 1.

As illustrated in FIG. 4, the thermally-conductive elastic body 100 according to the first embodiment of the present invention includes the elastic body (for example, the sponge) 110, the thermally conductive layer (or the thermally conductive sheet) 141 that is formed to be wrapped around the external surface of one portion of the elastic body (for example, the sponge) 110, and the adhesive or the bonding agent 120 with which the elastic body (for example, the sponge) 110 and the thermally conductive layer (or the thermally conductive sheet) 141 are attached to each other. As in a portion referred to by reference numeral 180 in FIG. 4, both ends (edges of the base film on which the graphite layer is not formed), in the lengthwise direction, of the thermally conductive layer (or the thermally conductive sheet) 141 that is formed to be wrapped around the external surface of one portion of the elastic body (for example, the sponge) 110 are folded inward in the direction of the elastic body (for example, the sponge) 110 and then are bonded with the adhesive or the bonding agent. Therefore, this increases smoothness and mechanical strength greatly than when performing a finishing treatment process in which the edges of the base film on which the graphite layer is not formed overlap. In addition, because the larger area of the graphite layer 140 is used, thermal conductivity may be increased.

The adhesive or the bonding agent 120 may be formed on a front surface of the thermally conductive layer (or the thermally conductive sheet) 141 and thus be attached to the elastic body (for example, the sponge) 110.

A protrusion portion, which results from folding both of the ends (the edges of the base film on which the graphite layer is not formed), in the lengthwise direction, of the thermally conductive layer (or the thermally conductive sheet) 141, is positioned within a groove in the elastic body (for example, the sponge) 110. A height of the protrusion portion is the as or similar to a depth of the groove.

The thermally-conductive elastic body 100 may further include a double-sided adhesive tape 160 and a release film 170. The double-side adhesive tape 160 is formed on at least one surface or multiple surfaces of the thermally-conductive elastic body 100 to come into contact with and thus facilitate the use of the heat generation source. The release film 170 is formed on the double-sided adhesive tape 160. The release film 170 is formed outside the double e-sided adhesive tape 160 in order to protect the double e-sided adhesive tape 160 until attached to the heat generation source. The release film 170 can be removed after the thermally-conductive elastic body 100 is attached to the electronic product or the like.

Figure 5:
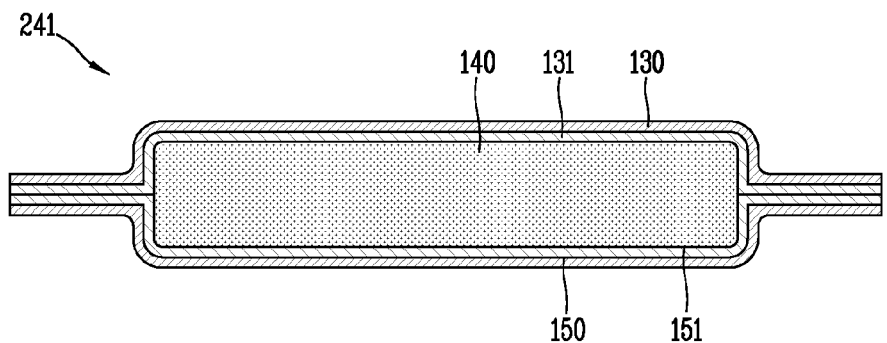
FIG. 5 is a view illustrating a thermally conductive layer that is applied to a thermally-conductive elastic body according to a second embodiment.

FIG. 5 is a view illustrating a thermally conductive layer that is applied to a thermally-conductive elastic body according to a second embodiment.

As illustrated in FIG. 5, the thermally conductive layer 241 according to the second embodiment includes a first adhesive or a first bonding agent 131 that is formed one surface of a graphite layer (or a graphite sheet) 140, a first base film 130 that is formed on the first adhesive or the first bonding agent 131, a second adhesive or a second bonding agent 151 that is formed on the other surface of the graphite layer (or the graphite sheet) 140, and a second base film 150 that is formed on the second adhesive or the second bonding agent 151.

The thermally conductive layer 241 according to the second embodiment may be formed by overlapping the first base film 130 within which the graphite layer (or the graphite sheet) 140 in FIG. 2 is internally positioned and the based film 150 within which the graphite layer (or the graphite sheet) 140 is internally positioned in such a manner that the graphite layer of the first base film 130 and the graphite layer of the second base film 150 come into contact with each other.

Therefore, the first base film 130 and the second base film 150 are attached to each other with their respective adhesives or bonding agents 131 and 151 outside the edge of the graphite layer 140. As a result, a phenomenon is prevented in which the small graphite fragments fall off the graphite 140.

The thickness of the graphite layer 140 ranges from 10 μm to 500 μm.

The first base film 130 is formed to the thickness of 5 μm to 50 μm. The second base film 150 that is wrapped around the elastic body 110 is 3 μm to 20 μm in thickness. If the second base film 150 is formed to the thickness of less than 3 μm, the second base film is not easy to handle. If the second base film 150 is equal to or more than 20 μm, the thermally-conductive elastic body may be easy to shape.

The first and second adhesives or the first and second bonding agents 131 and 151 are 5 μm to 50 μm in thickness. If the first and second adhesives or the bonding agents 131 and 151 are formed to the thickness of less than 5 μm, the bonding strength is decreased. If the first and second adhesives or the bonding agents 131 and 151 are formed to the thickness of equal to or more than 50 μm, the heat conduction efficiency is decreased.

Figure 6:
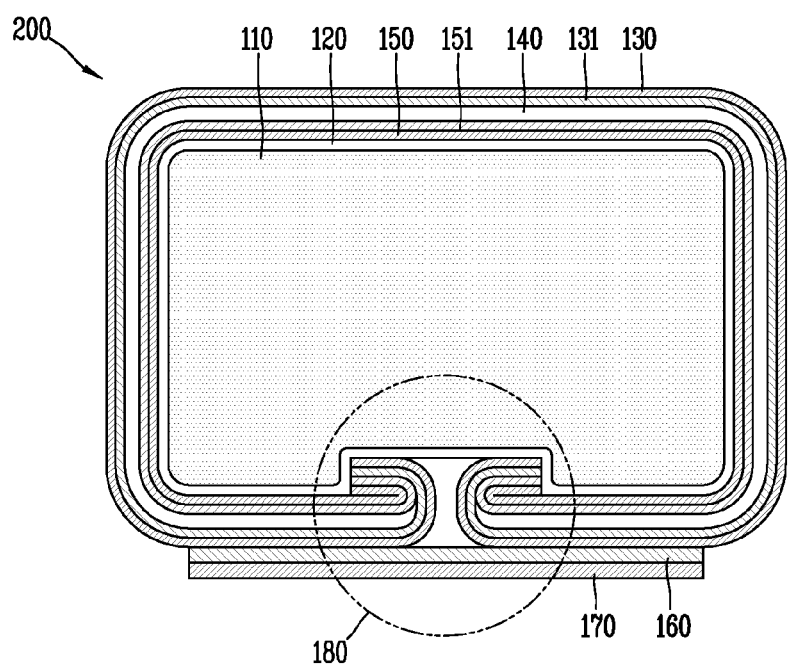
FIG. 6 is a view illustrating a cross section of the thermally-conductive elastic body that is formed as a result of wrapping the thermally conductive layer according to the second embodiment of the present invention around the elastic body.

FIG. 6 is a view illustrating a cross section of the thermally-conductive elastic body that is formed as a result of wrapping the thermally conductive layer according to the second embodiment of the present invention around the elastic body.

As illustrated in FIG. 6, the thermally-conductive elastic body 200 according to the second embodiment of the present invention includes the elastic body (for example, the sponge) 110, the thermally conductive layer (or the thermally conductive sheet) 241 that is formed to be wrapped around the external surface of one portion of the elastic body (for example, the sponge) 110, and the adhesive or the bonding agent 120 with which the elastic body (for example, the sponge) 110 and the thermally conductive layer (or the thermally conductive sheet) 241 are attached to each other. As in a portion referred to by reference numeral 180 in FIG. 6, both ends (edges of the base film on which the graphite layer is not formed), in the lengthwise direction, of the thermally conductive layer (or the thermally conductive sheet) 241 that is formed to be wrapped around the external surface of one portion of the elastic body (for example, the sponge) 110 are folded inward in the direction of the elastic body (for example, the sponge) 110 and then are bonded (attached) with the adhesive or the bonding agent. Therefore, this increases smoothness and mechanical strength greatly than when performing a finishing treatment process in which the edges of the base film on which the graphite layer is not formed overlap. In addition, because the larger area of the graphite layer 140 is used, thermal conductivity may be increased.

A protrusion portion, which results from folding both of the ends (the edges of the base film on which the graphite layer is not formed), in the lengthwise direction, of the thermally conductive layer (or the thermally conductive sheet) 241, is positioned within a groove in the elastic body (for example, the sponge) 110. A height of the protrusion portion is the as or similar to a depth of the groove.

The thermally-conductive elastic body 200 may further include a double-sided adhesive tape 160 and a release film 170. The double-side adhesive tape 160 is formed on at least one surface or multiple surfaces of the thermally-conductive elastic body to come into contact with and thus facilitate the use of the heat generation source. The release film 170 is formed on the double-sided adhesive tape 160. The release film 170 is formed outside the double-sided adhesive tape 160 in order to protect the double-sided adhesive tape 160 until attached to the heat generation source. The release film 170 can be removed after the thermally-conductive elastic body 100 is attached to the electronic product or the like.

The bonding agents 120, 131 and 151 are a hot-melt bonding agent or a liquefied resin bonding agent. A hot-melt bonding agent that has a melting point, a predetermined temperature or above, to improve heat resistance, is used as the bonding agents 120, 131, and 151. A hardened-type bonding agent, such as silicone resin or fluoride resin, is used as the liquefied resin bonding agent.

Acrylic, silicone, PU, fluoride resin, or like is used as resin for the adhesives 120, 131, and 151. In order to improve productivity or the thermal conductivity, an adhesive that coats both sides of a base material, such as a polyethylene terephthalate film, a polyimide film, aluminum foil, copper foil, or the like, is used as the adhesives 120, 131, and 151. A heat-resistant adhesive for improving heat-resistance may be used as the adhesives 120, 131, and 151.

The adhesives 120, 131, and 131 may be manufactured by adding any one or two or more functional additives, such as carbon nanotube (CNT), carbon, and metal power (for example, alumina power), to any one of acrylic, silicone, PU, fluoride resin. This is done to improve the thermal conductivity of the adhesives 120, 131, and 151.

The hot-melt adhesive is formed of any one of ethylene vinyl acetate, polyisobutylene, polyamide, polyethylene terephthalate, polypropylene, polyester, polyimide, and polyethylene.

When manufacturing the hot-melt bonding agent or the liquefied resin bonding agent, power with high thermal conductivity, such as metal power, alumina, CNT, carbon, or the like, may be added to the hot-melt bonding agent or the liquefied resin bonding agent. This is done to improve the thermal conductivity of the hot-melt bonding agent or of the liquefied resin bonding agent.

The hot-melt bonding agent does not need to go through a hardening or drying process, and thus has high bonding speed characteristics. Therefore, the high speed bonding contributes to production line automation and productivity improvement, resulting in considerable cost saving including labor cost saving.

In order to improve productivity or the thermal conductivity, an adhesive that coats both sides of a base material, such as a polyethylene terephthalate film, a polyimide film, aluminum foil, copper foil, or the like, is used for the double-sided adhesive tape 160. If the heat-resistant is required, the double-sided adhesive tape 160 may be formed of a heat-resistant material.

In a range where there is no problem with the adhesion to a heat generating object, such as the electronic product, the smaller the thickness of the double-sided adhesive tape 160, the larger the effect.

The first base film 130 and the second base film 150 may be formed of the same film. That is, the first base film 130 and the second base film 150 may be formed of any one of a polyethylene terephthalate (PET) film, a polyethylene (PE) film, a polypropylene (PP) film, an ethylene vinyl acetate (EVA) film, a polyvinylidene chloride (PVC) film, a polyimide (PI), a polyvinylidene chloride (PVDC) film, a polyurethane (PU) film, a polycarbonate (PC) film, and an acrylic resin film.

As described above, the graphite-sealed thermally-conductive elastic gasket according to the present invention is conveniently used in a state of being attached to the electronic products and the like and effectively dissipates the heat generated from the heat generation source such as the electronic product and the like to the outside. In addition, in the graphite-sealed thermally-conductive elastic gasket according to the present invention, the separation of the small graphite fragments from the graphite is prevented at the source. Therefore, when the graphite-sealed thermally-conductive elastic gasket according to the present invention is used in the state of being attached to the heat generation source such as the electronic product, the small fragments that fall off the graphite sheet due to an internal or external shock or due to the long-time usage are beforehand prevented from entering current-carrying portions of the electronic products and thus causing a short circuit, a fire, or a malfunction. Furthermore, the durability of the electronic product is improved and the reliability of the electronic product is increased.

The configuration and the method of the embodiments according to the present invention, described above, are not applied in a limiting manner, but all of or some of the embodiments may be selectively combined with each other to create various modifications to the embodiments.

It will also be apparent to those skilled in the art that various modifications and variations can be made in the present invention without departing from the spirit or scope of the invention. Thus, it is intended that the present invention cover modifications and variations of this invention provided they come within the scope of the appended claims and their equivalents.

The invention claimed is:

1. A thermally-conductive elastic body comprising:
an elastic body and
a thermally conductive layer that is formed to be wrapped around an external surface of the elastic body,
wherein the thermally conductive layer includes a first base film, a second base film and a graphite layer that is internally arranged between the first base film and the second base film,
wherein an edge region of the first base film is attached to the elastic body in such a manner that the graphite layer is sealed up,
wherein the thermally conductive layer further comprises:
a first adhesive layer with which one surface of the graphite layer and the first base film are attached to each other; and
a second adhesive layer being positioned between the second base film and the other surface of the graphite layer and attaching the second base film and the graphite layer, and
wherein the edge region of the first base film and an edge region of the second base film do not include the graphite layer and are attached to each other with the first and second adhesive layers.

2. The thermally-conductive elastic body according to claim 1, further comprising an adhesive layer or a bonding agent layer with which the edge region of the first base film is attached to the elastic body.

3. The thermally-conductive elastic body according to claim 2, wherein the bonding agent layer is a hot-melt bonding agent or a liquefied resin bonding agent.

4. The thermally-conductive elastic body according to claim 3, wherein the hot-melt bonding agent is formed of one that is selected from the group consisting of ethylene vinyl acetate (EVA), polyester, polyethylene, polyisobutylene, polyamide, polyurethane, polyethylene terephthalate, polypropylene, and polyimide.

5. The thermally-conductive elastic body according to claim 4, wherein the hot-melt bonding agent is one of hot-melt bonding agents that are obtained by including one or two more of carbon nanotube (CNT), carbon, alumina, and metal powder in any one of the hot-melt bonding agents.

6. The thermally-conductive elastic body according to claim 2, wherein the adhesive of the adhesive layer is one that is selected from the group consisting of an acrylic-adhesive, a silicone-based adhesive, a PU-based adhesive, and a fluoride-based adhesive.

7. The thermally-conductive elastic body according to claim 6, wherein the adhesive of the adhesive layer is one of adhesives that are obtained by including one or two more of carbon nanotube (CNT), carbon, alumina, and metal powder in any one of the adhesives.

8. The thermally-conductive elastic body according to claim 1, wherein an area of the first base film is greater than an area of the graphite layer.

9. The thermally-conductive elastic body according to claim 1, wherein the thermally conductive layer is wrapped around the external surface of the elastic body in such a manner that both end surfaces, in a lengthwise direction, of the elastic body, are opened.

10. The thermally-conductive elastic body according to claim 1, wherein both of the edge regions, in the lengthwise direction, of the first base film are folded inward in the direction of the elastic body and then are attached to the elastic body with an adhesive or a bonding agent.

11. The thermally-conductive elastic body according to claim 1, wherein a width of the edge region of the first base film ranges from 2 mm to 5 mm.

12. The thermally-conductive elastic body according to claim 1, wherein each of the first and second base films is one that is selected from the group consisting of a polyethylene terephthalate (PET) film, a polyethylene (PE) film, a polypropylene (PP) film, an ethylene vinyl acetate (EVA) film, a polyvinylidene chloride (PVC) film, a polyimide (PI), a polyvinylidene chloride (PVDC) film, a polyurethane (PU) film, a polycarbonate (PC) film, and an acrylic resin film.

13. The thermally-conductive elastic body according to claim 1, wherein the elastic body is one that is selected from the group consisting of polyurethane (PU)-based sponge, an acrylic-based sponge, a chloroprene rubber (CR)-based sponge, ethylene propylene diene M-class (EPDM) rubber-series sponge, a silicone-based sponge, a fluoride resin-based sponge, and a melamine resin-based sponge.

14. The thermally-conductive elastic body according to claim 13, wherein the elastic body is made of a conjugated material that is obtained by impregnating any one of the sponges with a solution of silicone or fluoride resin or melamine resin.

15. The thermally-conductive elastic body according to claim 1, wherein a thickness of the graphite layer ranges from 10 μm to 500 μm.

16. The thermally-conductive elastic body according to claim 1, further comprising a double-sided adhesive tape that is formed on at least one surface or multiple surfaces of the thermally-conductive elastic body.

* * * * *